United States Patent
Akiyama

(10) Patent No.: US 11,369,043 B2
(45) Date of Patent: Jun. 21, 2022

(54) BOARD HOUSING CASE

(71) Applicant: Mitsubishi Electric Corporation, Tokyo (JP)

(72) Inventor: Satoshi Akiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/276,867

(22) PCT Filed: Oct. 18, 2018

(86) PCT No.: PCT/JP2018/038828
§ 371 (c)(1),
(2) Date: Mar. 17, 2021

(87) PCT Pub. No.: WO2020/079801
PCT Pub. Date: Apr. 23, 2020

(65) Prior Publication Data
US 2022/0030737 A1    Jan. 27, 2022

(51) Int. Cl.
*H05K 7/20* (2006.01)
*H05K 5/04* (2006.01)
(Continued)

(52) U.S. Cl.
CPC .......... *H05K 7/205* (2013.01); *H05K 5/0008* (2013.01); *H05K 5/0052* (2013.01); *H05K 5/04* (2013.01);
(Continued)

(58) Field of Classification Search
CPC .. H05K 7/205; H05K 7/20854; H05K 5/0008; H05K 5/0052; H05K 5/04; H05K 5/06; H05K 5/062
See application file for complete search history.

(56) References Cited

U.S. PATENT DOCUMENTS 5,739,463 A * 4/1998 Diaz .................... H05K 5/0039
174/378
10,185,372 B1 * 1/2019 Heller .................... G06F 1/206
(Continued)

FOREIGN PATENT DOCUMENTS

JP    2015-122453 A    7/2015

OTHER PUBLICATIONS

International Search Report for PCT/JP2018/038828 dated Jan. 15, 2019 [PCT/ISA/210].

*Primary Examiner* — Hung V Ngo
(74) *Attorney, Agent, or Firm* — Sughrue Mion, PLLC; Richard C. Turner

(57) ABSTRACT

A heat generating component is mounted on a circuit board housed and fixed in a case including a base and a cover. Heat generated from the circuit board is transferred from a back surface of the circuit board via an insulating sheet to a heat transfer base portion formed on an inner surface of the base. Protruding portions configured to press the circuit board through elastic bodies are formed on an inner surface of the cover. When a peripheral portion of the circuit board is in pressure contact with and sandwiched between base-side and cover-side hold portions, curvature deformation of the peripheral portion of the circuit board occurs in a downward direction. Before start of the curvature deformation, the elastic bodies are brought into abutment against a front surface of the circuit board to suppress a reduction in pressure contact force on the insulating sheet.

15 Claims, 8 Drawing Sheets

(51) Int. Cl.
H05K 5/06 (2006.01)
H05K 5/00 (2006.01)

(52) U.S. Cl.
CPC ............... *H05K 5/06* (2013.01); *H05K 5/062* (2013.01); *H05K 7/20854* (2013.01)

(56) References Cited

U.S. PATENT DOCUMENTS

| | | | |
|---|---|---|---|
| 2013/0094151 A1* | 4/2013 | Escamilla | H05K 7/1427 29/829 |
| 2013/0321989 A1* | 12/2013 | Uesugi | H05K 5/0213 361/679.01 |
| 2017/0242464 A1* | 8/2017 | Okada | H05K 7/205 |
| 2017/0353020 A1* | 12/2017 | Yamashita | H05K 7/20409 |
| 2019/0157819 A1* | 5/2019 | Hieda | H05K 7/1432 |
| 2019/0223318 A1* | 7/2019 | Inoue | H05K 5/0008 |

* cited by examiner

BOARD HOUSING CASE

CROSS REFERENCE TO RELATED APPLICATIONS

This application is a National Stage of International Application No. PCT/JP2018/038828 filed Oct. 18, 2018.

TECHNICAL FIELD

This invention relates to a structure of a board housing case, which is to be applied to, for example, an on-vehicle electronic control device, and more particularly, to a board housing case that is improved to efficiently transfer heat generated from a heat generating component mounted on a circuit board to the board housing case.

BACKGROUND ART

There is publicly known a board housing case including a circuit board, a heat generating component, and a heat transfer base portion. The circuit board is hermetically sealed and housed in a case including a base made of a metal and a cover made of a resin or a metal. The heat generating component is mounted on a front surface of the circuit board, which is opposed to an inner surface of the cover. The heat transfer base portion is formed on an inner surface of the base, which is opposed to a back surface of the circuit board. Heat generated from the heat generating component is transferred and radiated to the base via the circuit board and the heat transfer base portion.

For example, according to FIG. 1 and FIG. 2 of Patent Literature 1 for a "power module", a power module 100 (corresponding to a "board housing case" of the present application) includes a circuit board 10, a semiconductor element 22 (corresponding to a "heat generating component" of the present application), and a case 50 having an insulating property (corresponding to a "cover made of a resin" of this application), which surrounds an outer periphery of the circuit board 10. The case 50 has two or more through holes 54A and 54B, a pressing portion 56 (corresponding to a "cover-side hold portion" of this application), and a projecting portion 58 (corresponding to a "protruding portion" of this application). The through holes 54A and 54B for insertion of screws 62A and 62B (corresponding to "fastening elements" of this application) configured to fix the case 50 to a heat radiation member 42 (corresponding to a "base made of a metal" of this application) are formed around the circuit board 10. The pressing portion 56 is configured to press a peripheral edge portion of the circuit board 10 from a first metal layer 14 side of the circuit board 10. The projecting portion 58 is configured to apply a force, which is otherwise received by the case 50 from the screws 62A and 62B inserted into the through holes 54A and 54B, to the circuit board 10.

According to the description in paragraph [0028] of Patent Literature 1, the circuit board 10 is bonded to the case 50 with, for example, an adhesive. For example, the semiconductor element 22 inside the case 50 is sealed with a sealing material 72 for protection against, for example, water, dust, and contact.

The sealing material 72 is, for example, a silicone-based gel or an epoxy-based hard resin. A second metal layer 16 is fixed to the heat radiation member 42 through a thermal interface material 32 such as silicone grease.

Further, according to paragraph [0009], the power module has the projecting portion 58 configured to apply the force, which is otherwise received by the case 50 from the screws 62A and 62B inserted into the through holes 54A and 54B, to the circuit board 10. Thus, deformation of the circuit board 10, which may occur as a result of pressing the peripheral edge portion of the circuit board 10 with the pressing portion 56, can be suppressed.

Thus, a clearance can be made less liable to be formed between the heat radiation member 42 to be mounted to the circuit board 10, such as a heat sink, and the circuit board 10. Accordingly, a power module having a high heat radiation property can be provided.

CITATION LIST

Patent Literature

[PTL 1] JP 2015-122453 A (FIG. 1, FIG. 2, Paragraphs [0008], [0009], and [0028])

SUMMARY OF INVENTION

Technical Problem (1) Description of Problems of Related Art

In the "power module" described in Patent Literature 1, heat generated from the semiconductor element 22 corresponding to the heat generating component is transferred and radiated to the heat radiation member 42 via the first metal layer 14, an insulating substrate 12, the second metal layer 16, and the thermal interface material 32 having thermal conductivity. Thus, there arises a problem in that, when a thermal conduction characteristic of the thermal interface material 32 degrades under an environment at high temperature or low temperature, a heat radiation characteristic with respect to the heat radiation member 42 may significantly degrade. Further, there arises a problem in that a step of bonding the circuit board 10 to the case 50 and a step of applying the thermal interface material 32 are required.

Further, there arises a problem in that, when the thermal interface material 32 shrinks due to a change in environmental temperature, a tightening pressure of each of the screws 62A and 62B may decrease to loosen the screws 62A and 62B.

When a thin-film insulating sheet is used in place of the thermal interface material 32 in order to avoid the problems described above, it is required that formation of a clearance between the second metal layer 16 and the insulating sheet be prevented because the insulating sheet has no elasticity. When a variation in thickness dimension of the insulating sheet, the deformation of the circuit board 10, or a bonding error between the circuit board 10 and the case 50 occurs, close contact of the insulating sheet is not achieved. As a result, there arises a problem in that heat resistance of heat transfer may occur.

Further, fastening and fixing a plurality of materials including the case 50, the circuit board 10, the insulating sheet, and the heat radiation member 42 together with use of the screws 62A and 62B may also be a cause of a problem.

(2) Description of Object of Invention

An object of this invention is to provide a board housing case having an inexpensive configuration, which is formed by integrating a cover made of a resin or a metal and a base made of a metal, the cover and the base being configured to hermetically seal and house a circuit board in a sandwiched manner, with fastening elements, and is configured to achieve a stable heat transfer characteristic between a heat generating component mounted on the circuit board and the base.

Solution to Problem

A board housing case according to this invention includes: a circuit board hermetically sealed and housed in a case including a base made of a metal and a cover made of a resin or a metal; a heat generating component being a surface-mount component mounted on a front surface of the circuit board, the front surface being opposed to an inner surface of the cover; and a heat transfer base portion formed on an inner surface of the base, the inner surface being opposed to a back surface of the circuit board. Heat generated from the heat generating component is transferred and radiated to the base via the circuit board and the heat transfer base portion.

The circuit board includes: solder resist films on a front side and a back side, the solder resist films being provided on signal patterns on a front side and a back side; a front-surface electroconductive pattern to which a heat transfer block of the heat generating component is to be soldered; and a back-surface electroconductive pattern connected to the front-surface electroconductive pattern through plated holes so as to transfer heat. An insulating sheet having a thickness dimension two or more times larger than a thickness dimension of each of the solder resist films is provided in a gap between the back-surface electroconductive pattern without the solder resist film and the heat transfer base portion.

A base-side hold portion and a cover-side hold portion are formed at positions along at least a pair of opposed sides of the base and at least a pair of opposed sides of the cover, respectively, and the base-side hold portion and the cover-side hold portion are integrated and fixed by a plurality of fastening elements configured to allow the base-side hold portion and the cover-side hold portion to be brought into pressure contact with and hold the circuit board in a sandwiched manner at positions along at least a pair of opposed sides of the circuit board.

Further, a height difference dimension G0 between a hold surface of the base-side hold portion and an upper surface of the heat transfer base portion before start of fastening of the base and the cover with the plurality of fastening elements is smaller than a minimum dimension of a thickness dimension T0 of the insulating sheet.

When the circuit board is mounted under a state in which the insulating sheet is placed on the upper surface of the heat transfer base portion, a residual gap of T0−G0>0 obtained by subtracting the height difference dimension G0 from the thickness dimension T0 is formed between the back surface of the circuit board and the base-side hold portion.

A plurality of protruding portions are formed on the inner surface of the cover, and an elastic body to be brought into abutment against the circuit board is provided to a distal end surface of each of the protruding portions.

When the cover is placed on an upper surface of the circuit board, the elastic bodies are first brought into abutment against the front surface of the circuit board. When tightening of the fastening elements is subsequently started, compression of the elastic bodies starts, and curvature deformation of the circuit board and the compression of the elastic bodies progress along with an operation of tightening the fastening elements.

A height dimension of each of the protruding portions and a thickness dimension of each of the elastic bodies are determined so that, at time of completion of the tightening of the fastening elements, the circuit board is in pressure contact with and sandwiched between the base-side hold portion and the cover-side hold portion, and the elastic bodies remain in a compressed state between the distal end surfaces of the protruding portions and the circuit board.

Advantageous Effects of Invention

As described above, in the board housing case according to one embodiment of this invention, the circuit board on which the heat generating component is mounted is housed and fixed in the case including the base and the cover in pair to be integrated with the fastening elements. The heat generated from the heat generating component is transferred and radiated from the back surface of the circuit board to the heat transfer base portion formed on the inner surface of the base.

The thickness dimension T0 of the insulating sheet provided between the back surface of the circuit board and the heat transfer base portion is set so as to be larger than the height difference dimension G0 between the base-side hold portion and the heat transfer base portion. As a result, the insulating sheet is held in pressure contact with the heat transfer base portion by the circuit board.

The protruding portions configured to press the circuit board through the elastic bodies is formed on the inner surface of the cover. Even when curvature deformation of the peripheral portion of the circuit board occurs along with an operation of tightening the fastening elements, a reduction in pressure contact force on the insulating sheet is suppressed by the protruding portions formed on the inner surface of the cover and the elastic bodies.

The height dimension of each of the protruding portions and the thickness dimension of each of the elastic bodies are determined so that, at the time of completion of the fastening of the cover and the base with the fastening elements, the circuit board is in pressure contact with and sandwiched between the base-side hold portion and the cover-side hold portion and the elastic bodies remain in a compressed state between the distal end surfaces of the protruding portions and the front surface of the circuit board.

Thus, even when a non-thermally conductive thin film material or a thermally conductive thin film sheet is used as the insulating sheet and the insulating sheet is less liable to be compressively deformed, a gap is not formed between the insulating sheet and each of the circuit board and the heat transfer base portion. Thus, a heat transfer characteristic can be stably obtained, and there is provided an effect of eliminating need for an extra working step such as supply and application of a thermal adhesive, in which degradation and variation of the heat transfer characteristic are liable to occur.

Further, there is provided an effect of improving the heat transfer characteristic by eliminating formation of the solder resist film on an area of the circuit board, which is opposed to the heat transfer base portion.

DESCRIPTION OF EMBODIMENTS

First Embodiment (1) Detailed Description of Configuration and Actions

Figure 1:
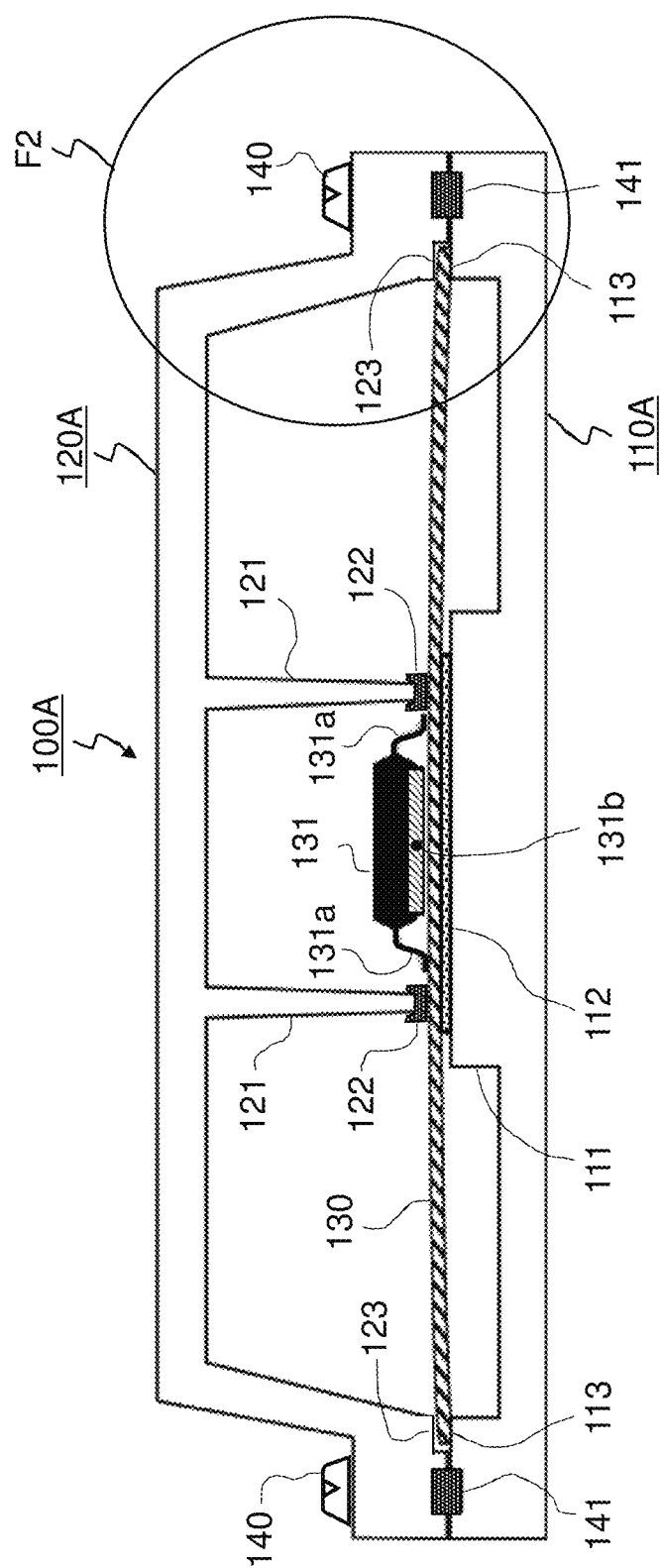
FIG. 1 is a sectional view for illustrating a configuration of a board housing case according to a first embodiment of this invention.
Figure 2:
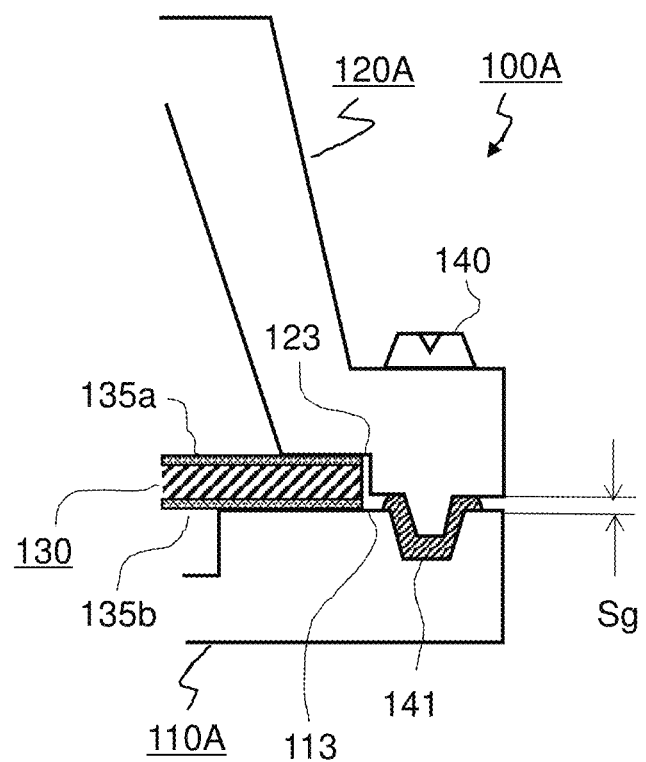
FIG. 2 is an enlarged view of a portion surrounded by a circle F2, which corresponds to a fastened portion in FIG. 1.
Figure 3A:
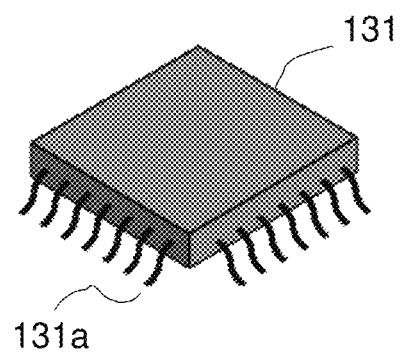
FIG. 3A is a front view of a heat generating component with lead terminals, which corresponds to a surface-mount component in FIG. 1.
Figure 3B:
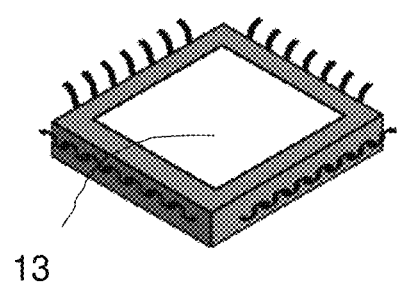
FIG. 3B is a back view of the heat generating component with the lead terminals, which corresponds to the surface-mount component in FIG. 1.
Figure 3C:
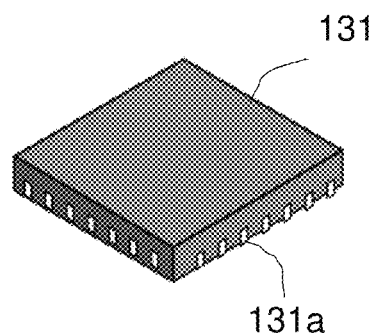
FIG. 3C is a front view of the heat generating component without lead terminals, which corresponds to the surface-mount component in FIG. 1.
Figure 3D:
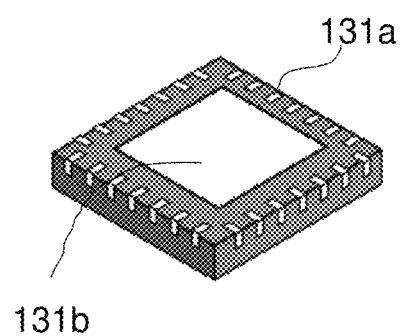
FIG. 3D is a back view of the heat generating component without lead terminals, which corresponds to the surface-mount component in FIG. 1.
Figure 4A:
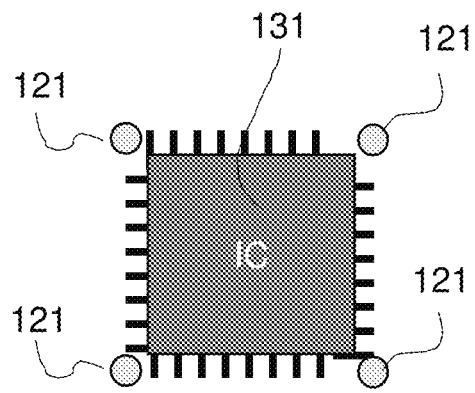
FIG. 4A is a front view when protruding portions are arranged at four corners of the heat generating component of FIG. 3A.
Figure 4B:
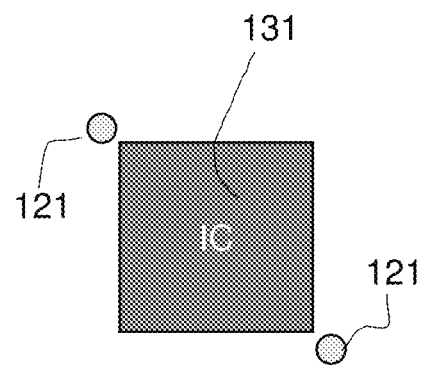
FIG. 4B is a front view when the protruding portions are arranged at two corners of the heat generating component of FIG. 3C.
Figure 4C:
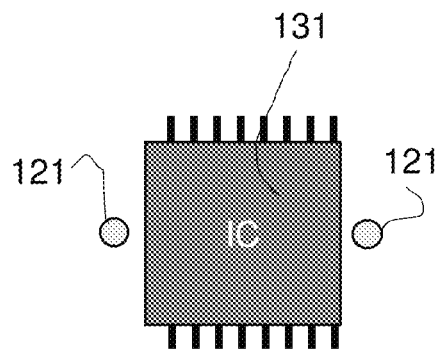
FIG. 4C is a front view when the protruding portions are arranged for the heat generating component having the lead terminals on two sides so as to be located in the vicinity of two sides without lead terminals.
Figure 5:
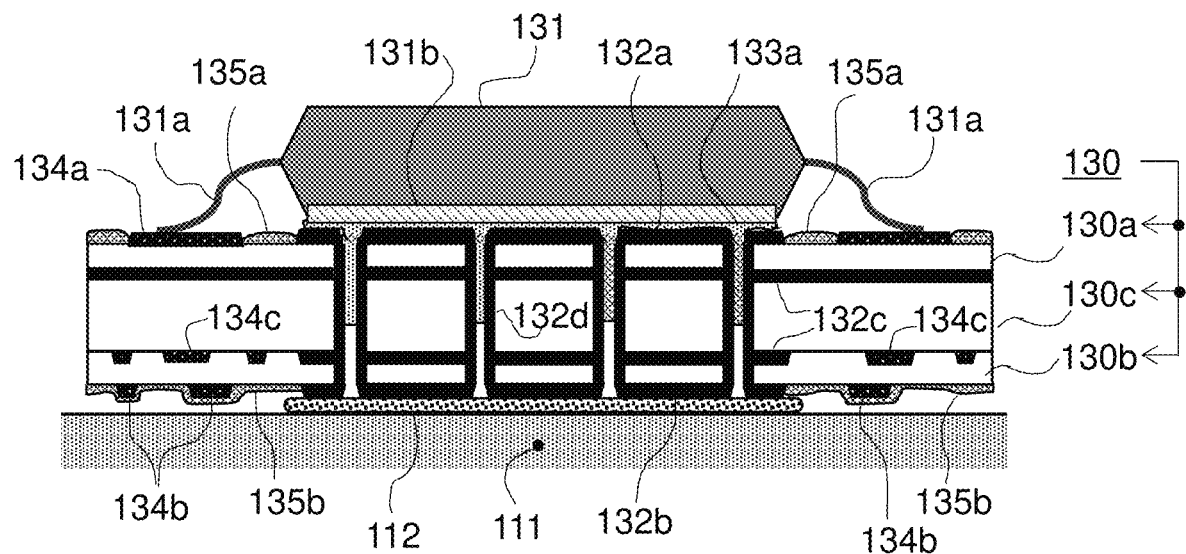
FIG. 5 is a sectional view of a circuit board in a heat generating component mounted portion in FIG. 1.

Now, with reference to FIG. 1, FIG. 2, FIG. 3A to FIG. 3D, FIG. 4A to FIG. 4C, and FIG. 5, configurations of a board housing case, a heat generating component, protruding portions, and a circuit board are described in order. FIG. 1 is a sectional view for illustrating the configuration of the board housing case according to a first embodiment of this invention. FIG. 2 is an enlarged view of a portion surrounded by a circle F2, which corresponds to a fastened portion in FIG. 1. FIG. 3A to FIG. 3D are exterior views of the heat generating component corresponding to a surface-mount component in FIG. 1. FIG. 4A to FIG. 4C are arrangement views of the protruding portions for the heat generating component corresponding to the surface-mount component in FIG. 1. FIG. 5 is a sectional view of the circuit board in a heat generating component mounted portion in FIG. 1.

First, in FIG. 1, a board housing case 100A configured to house a circuit board 130 having a rectangular shape includes, for example, a base 110A and a cover 120A. The base 110A is formed by aluminum die casting. The cover 120A is made of a resin. Fastening elements 140, for example, screws are provided in four corners to integrate the base 110A and the cover 120A with each other.

A thin-film insulating sheet 112 having a thickness of, for example, 100 μm is placed or applied onto a surface of a heat transfer base portion 111 that protrudes in an island-like manner at a center portion of the base 110A. The insulating sheet 112 may be an elastic insulating sheet with thermal conductivity, which has a thickness of, for example, 200 μm.

Further, a base-side hold portion 113 is formed on an outer peripheral portion of the base 110A along three sides.

Meanwhile, a plurality of protruding portions 121 are formed on an inner surface of the cover 120A. Distal end portions of the protruding portions 121 are to be brought into abutment against a front surface of the circuit board 130 through elastic bodies 122.

Further, a cover-side hold portion 123 is formed on an outer peripheral portion of the cover 120A along three sides. The cover-side hold portion 123 is opposed to the base-side hold portion 113, and a peripheral portion of the circuit board 130 is in pressure contact with and sandwiched between the cover-side hold portion 123 and the base-side hold portion 113 on three sides.

A heat generating component 131, which is described later with reference to FIG. 5, is mounted on the front surface of the circuit board 130. The heat generating component 131 includes electrode terminals 131a and a heat transfer block 131b, which are described later with reference to, for example, FIG. 3A and FIG. 3B.

Figure 8:
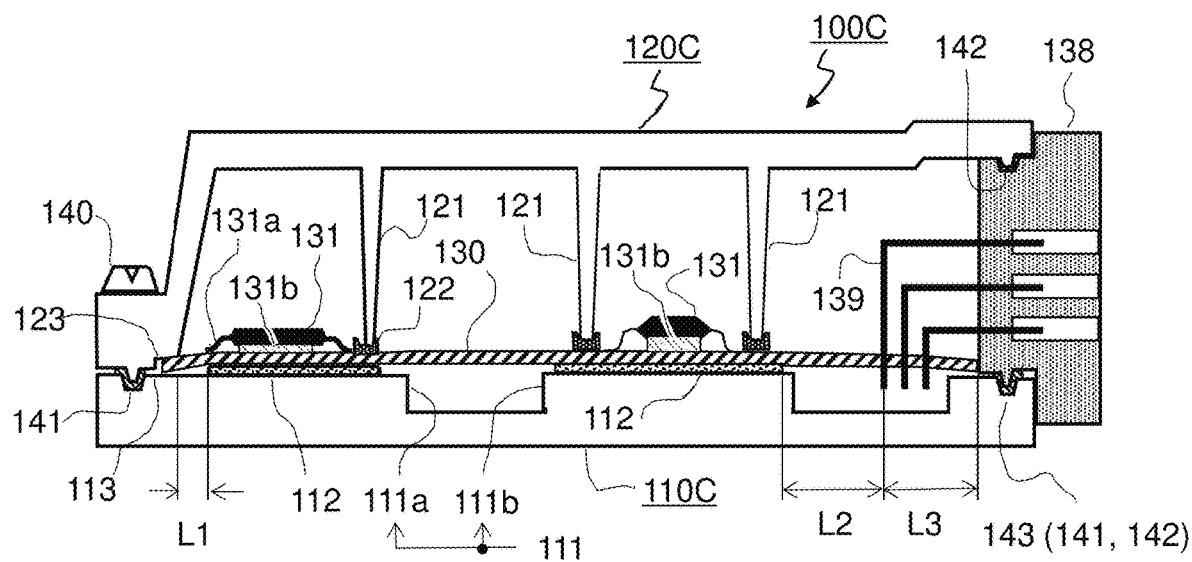
FIG. 8 is a sectional view for illustrating a configuration of a board housing case according to a third embodiment of this invention.

A connector housing 138, which is described later with reference to FIG. 8, is mounted to the other one side of the circuit board 130. The connector housing 138 is located on a back side in the drawing sheet of FIG. 1.

A first annular sealing material 141, which is described later with reference to FIG. 2 and FIG. 8, is provided to the outer peripheral portions of the base 110A and the cover 120A along four sides.

In FIG. 2, the base-side hold portion 113 is formed on the outer peripheral portion of the base 110A along the three sides. The base-side hold portion 113 is formed so as to extend to the other one side of the base 110A, as described later with reference to FIG. 8.

Further, the cover-side hold portion 123 is formed on the outer peripheral portion of the cover 120A along the three sides. Three sides of the circuit board 130 sandwiched between the cover-side hold portion 123 and the base-side hold portion 113 are brought into pressure contact therewith and sandwiched therebetween by the fastening elements 140. Solder resist films 135a and 135b on a front side and a back side are applied to held surfaces of the circuit board 130.

The first annular sealing material 141 is applied to a fitting surface of an elongated recessed portion formed at a position on the outer peripheral portion of the base 110A and a fitting surface of an elongated protruding portion formed on the cover 120A side. When the circuit board 130 is in pressure contact with and sandwiched between the base-side hold portion 113 and the cover-side hold portion 123, an air gap portion Sg through which excessively applied part of the first annular sealing material 141 flows out is formed.

In FIG. 3A to FIG. 3D, which are exterior views of the heat generating component 131 corresponding to the surface-mount component, FIG. 3A is a front view of the heat generating component with lead terminals, FIG. 3B is a back view of the heat generating component with the lead terminals, FIG. 3C is a front view of the heat generating component without lead terminals, and FIG. 3D is a back view of the heat generating component without lead terminals.

In any case, the heat transfer block 131b is exposed on a back surface of the heat generating component 131. A plurality of the electrode terminals 131a are arranged on the same surface as a mount surface for the heat transfer block 131b regardless of whether or not the heat generating component 131 has the lead terminals.

The electrode terminals 131a are provided to four sides or two opposed sides of the heat generating component 131.

In FIG. 4A to FIG. 4C, which are arrangement views of the protruding portions 121 for the heat generating component 131 corresponding to the surface-mount component, FIG. 4A is a top view when the protruding portions 121 are arranged at four corners of the heat generating component 131 of FIG. 3A, FIG. 4B is a top view when the protruding portions 121 are arranged at two corners of the heat generating component 131 of FIG. 3C, and FIG. 4C is a top view when the protruding portions 121 are arranged for the heat generating component 131 having the lead terminals on two sides so as to be located in the vicinity of two sides without lead terminals.

In FIG. 5, the heat generating component 131 including the electrode terminals 131a and the heat transfer block 131b is mounted on the circuit board 130 that is in pressure contact with an upper surface of the heat transfer base portion 111 through the insulating sheet 112. The circuit board 130 includes a front-layer base material 130a, a back-layer base material 130b, and a middle-layer base material 130c, which are insulating base materials of the circuit board 130. A front-surface electroconductive pattern 132a, a back-surface electroconductive pattern 132b, and inner-layer electroconductive patterns 132c, which are conductive foils, signal patterns 134a and 134b on a front side and a back side, and an inner-layer signal pattern 134c are provided to the front-layer base material 130a, the back-layer base material 130b, and the middle-layer base material 130c.

The front-surface electroconductive pattern 132a is soldered to the heat transfer block 131b through a front-surface heat transfer solder layer 133a. The front-surface electroconductive pattern 132a, the back-surface electroconductive pattern 132b, and the inner-layer electroconductive patterns 132c are electrically conductively connected to each other through through-hole plating layers 132d.

Solder resist films 135a and 135b on the front side and the back side are applied to the signal patterns 134a and 134b on the front side and the back side except for soldered-joint portions. The electrode terminals 131a are joined by soldering to the signal pattern 134a on the front side.

Part of a solder of the front-surface heat transfer solder layer 133a that connects the heat transfer block 131b and the front-surface electroconductive pattern 132a flows into plated through holes. However, the solder does not reach the back-surface electroconductive pattern 132b, and the insulating sheet 112 is brought into pressure contact with the back-surface electroconductive pattern 132b.

Figure 6A:
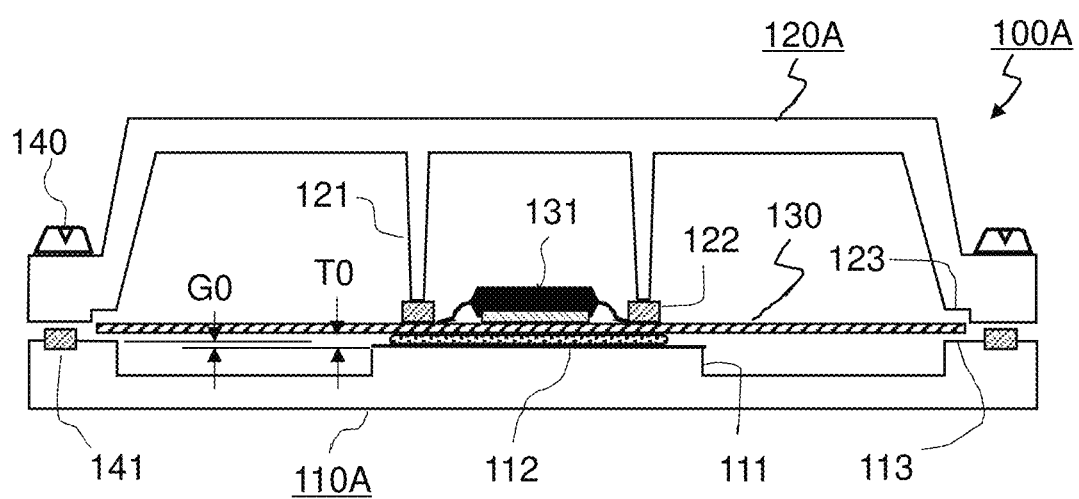
FIG. 6A is a sectional view for illustrating a state of a base and a cover of FIG. 1 in a pre-fastening stage.
Figure 6B:
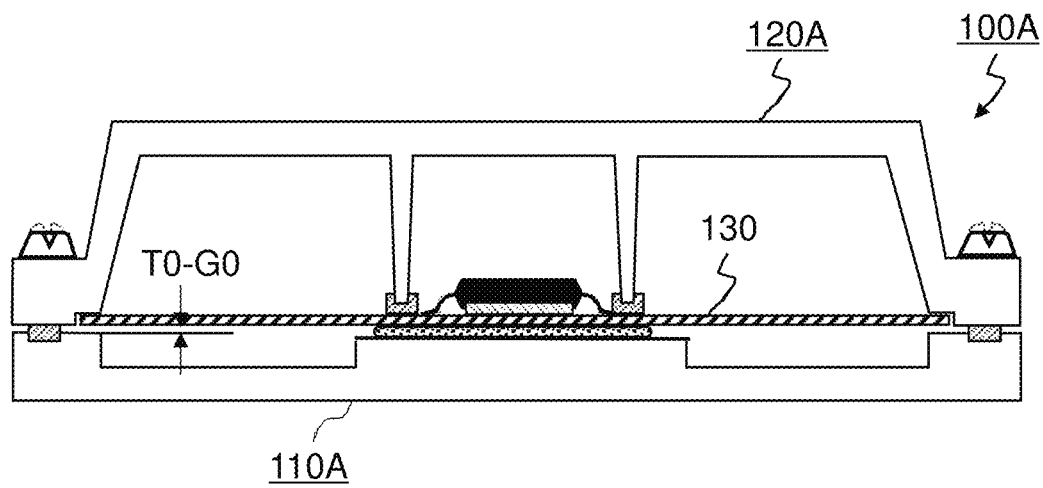
FIG. 6B is a sectional view for illustrating a state of the base and the cover of FIG. 1 in a fastening start stage.
Figure 6C:
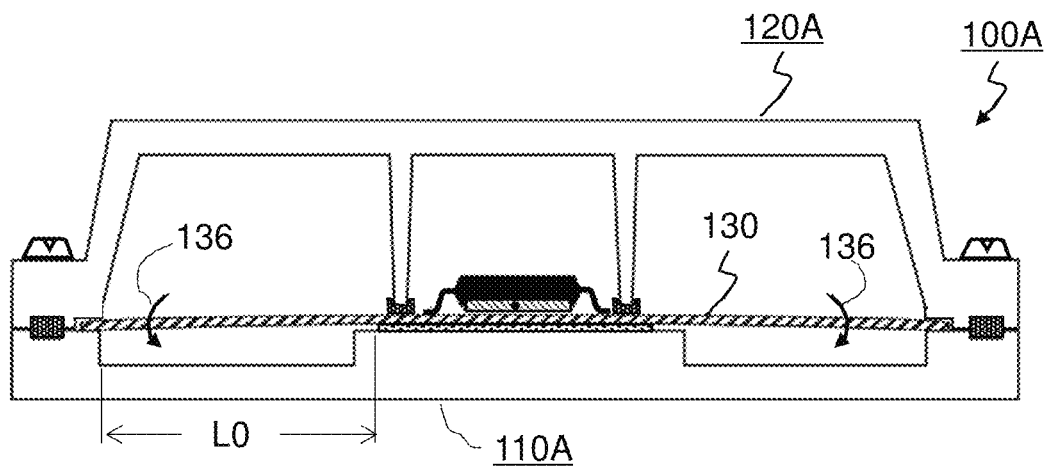
FIG. 6C is a sectional view for illustrating a fastening completion state of the base and the cover of FIG. 1.

Next, a positional relationship in a main part is described in accordance with a procedure of assembly of the board housing case 100A with reference to FIG. 6A to FIG. 6C. FIG. 6A to FIG. 6C are sectional views for illustrating transition states of fastening of the base 110A and the cover 120A in FIG. 1.

FIG. 6A corresponds to a pre-fastening stage. In this stage, the first annular sealing material 141 is applied to the outer peripheral portion of the base 110A to form an annular shape. After that, the heat generating component 131 and the circuit board 130, on which the connector housing 138 illustrated in FIG. 8 are mounted, are mounted on the upper surface of the heat transfer base portion 111 through the insulating sheet 112. Subsequently, the cover 120A provided with the protruding portions 121 are lowered to be brought closer to the circuit board 130. The elastic bodies 122 are provided to the distal end portions of the protruding portions 121. In FIG. 6A, the positional relationship in the main part at a time point of start of contact of the elastic bodies 122 with the front surface of the circuit board 130 is illustrated.

In this case, a height difference dimension G0 is a dimension between the upper surface of the heat transfer base portion 111 and a front surface of the base-side hold portion 113. The upper surface of the heat transfer base portion 111 is located at a position lower than the front surface of the base-side hold portion 113 to satisfy a relationship of G0>0.

Further, a thickness dimension T0 of the insulating sheet 112 is set so as to be larger than the height difference dimension G0 even when including dimensional errors of the portions, and is set to satisfy, for example, a relationship of T0≥100 μm.

FIG. 6B corresponds to a fastening start stage. In this stage, the cover 120A is further lowered by the fastening elements 140. In FIG. 6B, there is illustrated the positional relationship in the main part at a time point of abutment of a lower surface of the cover-side hold portion 123 against the front surface portion of the circuit board 130 while the elastic bodies 122 are being compressed.

At this time point, a residual gap T0−G0 corresponds to a gap dimension between a back surface portion of the circuit board 130 and the front surface of the base-side hold portion 113.

When it is assumed that the circuit board 130 has curvature deformation and that a center portion thereof projects in a downward direction of FIG. 6A under the state of FIG. 6A, the peripheral portion of the circuit board 130 is brought into abutment against the cover-side hold portion 123 before the elastic bodies 122 are brought into abutment against the circuit board 130. The state shifts to the state of FIG. 6B while the curvature deformation of the circuit board 130 is being corrected along with the lowering of the cover 120A.

A reaction force for correcting the curvature deformation of the circuit board 130 acts against the circuit board 130 and the upper surface of the heat transfer base portion 111 on which the insulating sheet 112 is provided, and a pressing force by the protruding portions 121 does not act.

In FIG. 6C corresponding to a fastening completion stage, there is illustrated a state in which the cover 120A is further lowered by the fastening elements 140 to complete achievement of a pressure-contact and sandwiched state of the circuit board 130. In this stage, the circuit board 130 is curved in a direction indicated by arrows 136 so as to absorb the residual gap T0−G0.

In this case, a distance from a pressure-contact and sandwiched portion of the circuit board 130 to an end surface of the insulating sheet 112 is represented as an arm length L0. Then, an average inclination angle θ of a curved portion is expressed by Mathematical Expression (1).

$$\theta \approx (T0-G0)/L0 \text{(rad)} \tag{1}$$

For example, when T0−G0=100 to 200 μm and L0≥5 mm are given, θ=0.02 to 0.04 (rad)=3.6 to 7.2 (deg) is obtained.

When it is assumed that the circuit board 130 has the curvature deformation and that the center portion thereof projects in an upward direction of FIG. 6A under the state of FIG. 6A, the peripheral portion of the circuit board 130 is in contact neither with the base-side hold portion 113 nor with the cover-side hold portion 123 at the time point of abutment of the elastic bodies 122 against the circuit board 130. The state shifts to the state of FIG. 6C while the curvature deformation of the circuit board 130 is further promoted along with the lowering of the cover 120A.

A reaction force for promoting the curvature deformation of the circuit board 130 acts against the circuit board 130 and the upper surface of the heat transfer base portion 111 on which the insulating sheet 112 is provided, and the pressing force by the protruding portions 121 does not act.

(2) Gist and Features of First Embodiment

As is apparent from the description given above, the board housing case 100A according to the first embodiment of this invention includes the circuit board 130 that is hermetically sealed and housed in the case including the base 110A made of a metal and the cover 120A made of a resin, the heat generating component 131 corresponding to the surface-mount component mounted on the front surface of the circuit board 130, which is opposed to the inner surface of the cover 120A, and the heat transfer base portion 111 formed on the inner surface of the base 110A, which is opposed to the back surface of the circuit board 130. Heat generated from the heat generating component 131 is transferred and radiated to the base 110A via the circuit board 130 and the heat transfer base portion 111.

The circuit board 130 includes the solder resist films 135a and 135b on the front side and the back side, which are provided on the signal patterns 134a and 134b on the front side and the back side, respectively, the front-surface electroconductive pattern 132a to which the heat transfer block 131b of the heat generating component 131 is to be soldered, and the back-surface electroconductive pattern 132b connected to the front-surface electroconductive pattern 132a through the plated holes so as to transfer heat. The insulating sheet 112 having a thickness dimension two or more times larger than each of thickness dimensions of the solder resist films 135a and 135b is provided in the gap between the back-surface electroconductive pattern 132b on which the solder resist film 135b is not formed and the heat transfer base portion 111.

The base-side hold portion 113 and the cover-side hold portion 123 are formed at positions along at least one pair of opposed sides of the base 110A and along at least one pair of opposed sides of the cover 120A, respectively. The base-side hold portion 113 and the cover-side hold portion 123 are integrated and fixed by the plurality of fastening elements 140 configured to allow the base-side hold portion 113 and the cover-side hold portion 123 to be brought into pressure contact with and hold the circuit board 130 in a sandwiched manner at positions along at least one pair of opposed sides.

The height difference dimension G0 between the hold surface of the base-side hold portion 113 and the upper surface of the heat transfer base portion 111 before the start of fastening of the base 110A and the cover 120A with the plurality of fastening elements 140 is smaller than a minimum dimension of the thickness dimension T0 of the insulating sheet 112.

When the circuit board 130 is mounted under a state in which the insulating sheet 112 is placed on the upper surface of the heat transfer base portion 111, the residual gap of T0−G0>0, which is obtained by subtracting the height difference dimension G0 from the thickness dimension T0, is formed between the back surface of the circuit board 130 and the base-side hold portion 113.

The plurality of protruding portions 121 are formed on the inner surface of the cover 120A. The elastic bodies 122 to be brought into abutment against the circuit board 130 are provided to the distal end surfaces of the protruding portions 121.

When the cover 120A is placed on the upper surface of the circuit board 130, the elastic bodies 122 are first brought into abutment against the front surface of the circuit board 130. When tightening of the fastening elements 140 is subsequently started, compression of the elastic bodies 122 starts. The curvature deformation of the circuit board 130 and the compression of the elastic bodies 122 progress along with an operation of tightening the fastening elements 140.

A height dimension of each of the protruding portions 121 and a thickness dimension of each of the elastic bodies 122 are determined so that, at the time of completion of the tightening of the fastening elements 140, the circuit board 130 is in pressure contact with and sandwiched between the base-side hold portion 113 and the cover-side hold portion 123, and the elastic bodies 122 remain in a compressed state between the distal end surfaces of the protruding portions 121 and the front surface of the circuit board 130.

An annular groove formed by the elongated recessed portion and the elongated protruding portion is formed in the outer peripheral portions of the base 110A and the cover 120A along contours thereof, and the first annular sealing material 141 is filled and applied thereto.

The annular groove forms the air gap portion Sg into which the surplus part of the first annular sealing material 141 flows out under a state in which the circuit board 130 is in pressure contact with and sandwiched between the base-side hold portion 113 and the cover-side hold portion 123.

The elastic bodies 122 are made of a silicone resin-based adhesive material having the same hardness as that of the first annular sealing material 141.

As described above, in relation to claim 2 of this invention, the annular groove to which the first annular sealing material is to be filled and applied is formed in the outer peripheral portions of the base and the cover along the contours to form a waterproof structure. The elastic bodies provided to the protruding portions formed on the cover are made of the silicone resin material having the same hardness as that of the first annular sealing material.

Thus, the first embodiment has a feature in that the same material is used for the elastic bodies and the first annular sealing material to thereby improve ease of assembly work and achieve an inexpensive configuration.

Further, the first embodiment has a feature in that a dimension of compression of each of the elastic bodies provided to the distal ends of the protruding portions, which is given when the circuit board is in pressure contact with and sandwiched between the base-side hold portion and the cover-side hold portion, does not vary depending on the amount of supply of the first annular sealing material and is determined by the residual gap T0−G0 between the back surface of the circuit board and the base-side hold portion.

A second embodiment and a third embodiment also have the same features.

The heat generating component 131 has the rectangular shape with the electrode terminals 131a of protruding type or non-protruding type on one or two pairs of opposite sides, and includes the heat transfer block 131b to be soldered to the front-surface electroconductive pattern 132a of the circuit board 130.

The protruding portions 121 are arranged at one or two pairs of corners of the heat generating component 131 or at intermediate positions along a pair of opposite sides without the electrode terminals 131a.

As described above, in relation to claim 5 of this invention, the protruding portions formed on the inner surface of the cover are arranged at one or two pairs of corners of the heat generating component or at the positions of a pair of opposed sides without the electrode terminals.

Thus, the first embodiment has a feature in that a wiring pattern is not provided on pressed portions of the circuit board by the protruding portions so as to enable prevention of damage of the wiring pattern, which may be caused by the protruding portions.

The second embodiment and the third embodiment also have the same feature.

Second Embodiment (1) Detailed Description of Configuration and Actions

Figure 7:
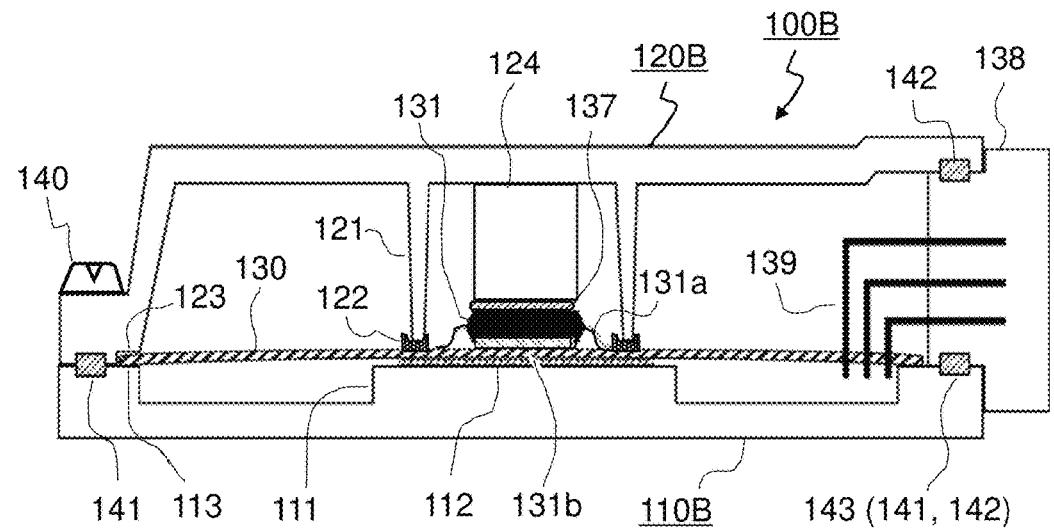
FIG. 7 is a sectional view for illustrating a configuration of a board housing case according to a second embodiment of this invention.

Now, with reference to FIG. 7, a configuration and actions of a board housing case according to a second embodiment of this invention are described mainly for differences from those of FIG. 1. FIG. 7 is a sectional view of the configuration of the board housing case according to the second embodiment of this invention.

In the drawings, a waterproof board housing case 100B in the second embodiment corresponds to the waterproof board housing case 100A in the first embodiment. Different alphabet capital letters in reference symbols represent different embodiments.

The cover 120A in the first embodiment is made of a resin. However, a cover 120B in the second embodiment is made of a metal, and a heat transfer protrusion 124 is additionally formed on an inner surface of the cover 120B.

Further, in FIG. 7, the connector housing 138, illustration of which is omitted in FIG. 1, is illustrated.

First, in FIG. 7, the board housing case 100B configured to house the circuit board 130 having a rectangular shape includes, for example, a base 110B formed by aluminum die casting and a cover 120B formed by aluminum die casting similarly to the base 110B. The fastening elements 140, for example, screws are provided in four corners to integrate the base 110B and the cover 120B with each other.

The thin-film insulating sheet 112 having a thickness of, for example, 100 μm is placed or applied onto the surface of the heat transfer base portion 111 that protrudes in an island-like manner at a center portion of the base 110B. The insulating sheet 112 may be an elastic insulating sheet with thermal conductivity, which has a thickness of, for example, 200 μm.

Further, the base-side hold portion 113 is formed on an outer peripheral portion of the base 110B along three sides.

Meanwhile, the plurality of protruding portions 121 are formed on the inner surface of the cover 120B. The distal end portions of the protruding portions 121 are to be brought into abutment against the front surface of the circuit board 130 through the elastic bodies 122.

Further, the cover-side hold portion 123 is formed on an outer peripheral portion of the cover 120B along three sides. The cover-side hold portion 123 is opposed to the base-side hold portion 113, and the peripheral portion of the circuit board 130 is in pressure contact with and sandwiched between the cover-side hold portion 123 and the base-side hold portion 113 on three sides.

The heat generating component 131, which has been described above with reference to FIG. 5, is mounted on the front surface of the circuit board 130. The heat generating component 131 includes the electrode terminals 131a and the heat transfer block 131b, which have been described above with reference to, for example, FIG. 3A and FIG. 3B.

The heat transfer protrusion 124 is integrally formed on the inner surface of the cover 120B. The heat transfer protrusion 124 is to be brought into contact with an outer surface portion of the heat generating component 131 through a thermal adhesive 137.

The connector housing 138 made of a resin is provided to a side opening portion of the cover 120B. The connector housing 138 hermetically seals and houses the circuit board 130 with a second annular sealing material 142 provided between the side opening portion of the cover 120B and one side of the base 110B. The first annular sealing material 141 and the second annular sealing material 142 three-dimensionally cross each other with a common-portion annular sealing material 143 provided on the base 110B along the one side as a common portion.

A plurality of connection terminals 139 for wiring connection to an external device are press-fitted and held in the connector housing 138. At the same time, orthogonally bent portions of the connection terminals 139 are soldered to the circuit board 130.

(2) Gist and Features of Second Embodiment

As is apparent from the description given above, the board housing case 100B according to the second embodiment of this invention includes the circuit board 130 that is hermetically sealed and housed in the case including the base 110B made of a metal and the cover 120B made of a metal, the heat generating component 131 corresponding to the surface-mount component mounted on the front surface of the circuit board 130, which is opposed to the inner surface of the cover 120B, and the heat transfer base portion 111 formed on an inner surface of the base 110B, which is opposed to the back surface of the circuit board 130. Heat generated from the heat generating component 131 is transferred and radiated to the base 110B via the circuit board 130 and the heat transfer base portion 111.

The circuit board 130 includes the solder resist films 135a and 135b on the front side and the back side, which are provided on the signal patterns 134a and 134b on the front side and the back side, respectively, the front-surface electroconductive pattern 132a to which the heat transfer block 131b of the heat generating component 131 is to be soldered, and the back-surface electroconductive pattern 132b connected to the front-surface electroconductive pattern 132a through the plated holes so as to transfer heat. The insulating sheet 112 having a thickness dimension two or more times larger than each of the thickness dimensions of the solder resist films 135a and 135b is provided in the gap between the back-surface electroconductive pattern 132b on which the solder resist film 135b is not formed and the heat transfer base portion 111.

The base-side hold portion 113 and the cover-side hold portion 123 are formed at positions along at least one pair of opposed sides of the base 110B and along at least one pair of opposed sides of the cover 120B, respectively. The base-side hold portion 113 and the cover-side hold portion 123 are integrated and fixed by the plurality of fastening elements 140 configured to allow the base-side hold portion 113 and the cover-side hold portion 123 to be brought into pressure contact with and hold the circuit board 130 in a sandwiched manner at positions along at least one pair of opposed sides.

The height difference dimension G0 between the hold surface of the base-side hold portion 113 and the upper surface of the heat transfer base portion 111 before the start of fastening of the base 110B and the cover 120B with the plurality of fastening elements 140 is smaller than the minimum dimension of the thickness dimension T0 of the insulating sheet 112.

When the circuit board 130 is mounted under a state in which the insulating sheet 112 is placed on the upper surface of the heat transfer base portion 111, the residual gap of T0−G0>0, which is obtained by subtracting the height difference dimension G0 from the thickness dimension T0, is formed between the back surface of the circuit board 130 and the base-side hold portion 113.

The plurality of protruding portions 121 are formed on the inner surface of the cover 120B. The elastic bodies 122 to be brought into abutment against the circuit board 130 are provided to the distal end surfaces of the protruding portions 121.

When the cover 120B is mounted on the upper surface of the circuit board 130, the elastic bodies 122 are first brought into abutment against the front surface of the circuit board 130. Subsequently, when tightening of the fastening elements 140 is started, compression of the elastic bodies 122 starts. Along with an operation of tightening the fastening elements 140, the curvature deformation of the circuit board 130 and the compression of the elastic bodies 122 progress.

The height dimension of each of the protruding portions 121 and the thickness dimension of each of the elastic bodies 122 are determined so that, at the time of completion of the tightening of the fastening elements 140, the circuit board 130 is in pressure contact with and sandwiched between the base-side hold portion 113 and the cover-side hold portion 123, and the elastic bodies 122 remain in a compressed state between the distal end surfaces of the protruding portions 121 and the front surface of the circuit board 130.

The cover 120B is formed by aluminum die casting. In addition to the protruding portions 121, the heat transfer protrusion 124 is formed on the inner surface of the cover 120B.

The thermal adhesive 137 is applied to a gap portion formed between a non-soldered surface of the heat generating component 131 that is joined by soldering to the circuit board 130 and an opposed surface of the heat transfer protrusion 124.

As described above, in relation to claim 4 of this invention, the heat transfer protrusion is formed on the inner surface of the cover formed by aluminum die casting, and is opposed to the non-soldered surface of the heat generating component. The thermal adhesive is applied to the gap portion formed between the opposed surfaces.

Thus, a gap dimension of the gap portion between the opposed surfaces of the heat generating component and the heat transfer protrusion is set to be sufficiently large. In this manner, even when an associated component has a variation in dimension, the heat generating component is not directly brought into pressure contact with the heat transfer protrusion. Thus, the second embodiment has a feature in that a heat radiation property for the heat generating component can be improved through the thermal adhesive.

Third Embodiment (1) Detailed Description of Configuration and Actions

Now, with reference to FIG. 8, a configuration and actions of a board housing case according to a third embodiment of this invention are described mainly for differences from those of FIG. 1. FIG. 8 is a sectional view of the configuration of the board housing case according to the third embodiment of this invention.

In the drawings, a waterproof board housing case 100C in the third embodiment corresponds to the waterproof board housing case 100A in the first embodiment. Different alphabet capital letters in reference symbols represent different embodiments.

Further, the heat transfer base portion 111 in the first embodiment is formed in the center portion of the circuit board 130. In the third embodiment, however, a heat transfer base portion 111 is close to the hold portions or close to the connector housing 138.

Further, in FIG. 8, the connector housing 138, illustration of which is omitted in FIG. 1, is illustrated.

First, in FIG. 8, the board housing case 100C configured to house the circuit board 130 having a rectangular shape includes, for example, a base 110C formed by aluminum die casting and a cover 120C made of a resin or a metal. The fastening elements 140, for example, screws are provided in four corners to integrate the base 110C and the cover 120C with each other.

The thin-film insulating sheet 112 having a thickness of, for example, 100 μm is placed or applied onto a surface of a heat transfer base portion 111a that protrudes at a peripheral portion (left end of FIG. 8 in this example) of the base 110C. Similarly to the first embodiment, the insulating sheet 112 may be an elastic insulating sheet with thermal conductivity, which has a thickness of, for example, 200 μm.

Further, a heat transfer base portion 111b is formed at a position close to the connector housing 138, which is described later, on a center portion of the base 110C. The same insulating sheet 112 is placed or applied thereonto.

The circuit board 130 is sandwiched between the base-side hold portion 113 that is formed on an outer peripheral portion of the base 110C along three sides and the cover-side hold portion 123 that is formed on an outer peripheral portion of the cover 120C along three sides.

Meanwhile, the plurality of protruding portions 121 are formed on an inner surface of the cover 120C. Distal end portions of the protruding portions 121 are to be brought into abutment against the front surface of the circuit board 130 through the elastic bodies 122.

For the heat transfer base portion 111a on a peripheral portion side, however, some of the protruding portions 121 are omitted.

The heat generating component 131, which has been described above with reference to FIG. 5, is mounted on the front surface of the circuit board 130. The heat generating component 131 includes the electrode terminals 131a and the heat transfer block 131b, which have been described above with reference to, for example, FIG. 3A and FIG. 3B.

The connector housing 138 made of a resin is provided to a side opening portion of the cover 120C. The connector housing 138 hermetically seals and houses the circuit board 130 with the second annular sealing material 142 provided between the side opening portion of the cover 120C and one side of the base 110C. The first annular sealing material 141 and the second annular sealing material 142 three-dimensionally cross each other with the common-portion annular sealing material 143 provided on the base 110C along the one side as a common portion.

The plurality of connection terminals 139 for wiring connection to an external device are press-fitted and held in the connector housing 138. The orthogonally bent portions of the connection terminals 139 are soldered to the circuit board 130.

When the heat transfer base portion 111a is arranged at a position shifted closer to the base-side hold portion 113, a first arm length L1 corresponding to a distance dimension between an inner end portion of the cover-side hold portion 123 and an opposed end surface of the insulating sheet 112 has a value four or more times larger than a thickness dimension of the circuit board 130. The protruding portions 121 are omitted at positions in the vicinity of the heat generating component 131, which are close to the cover-side hold portion 123.

Further, when the heat transfer base portion 111b is formed at a position close to the connection terminals 139 press-fitted in the connector housing 138, a second arm length L2 corresponding to a dimension from an end surface of the insulating sheet 112 placed on the heat transfer base portion 111b to the orthogonally bent portion of the connection terminal 139 is equal to or larger than a dimension L3 of a horizontally projecting portion of the connection terminal 139 press-fitted into and fixed to the connector housing 138.

(2) Gist and Features of Third Embodiment

As is apparent from the description given above, the board housing case 100C according to the third embodiment of this invention includes the circuit board 130 that is hermetically sealed and housed in the case including the base 110C made of a metal and the cover 120C made of a resin or a metal, the heat generating component 131 corresponding to the surface-mount component mounted on the front surface of the circuit board 130, which is opposed to the inner surface of the cover 120C, and the heat transfer base portion 111 formed on the inner surface of the base 110C, which is opposed to the back surface of the circuit board 130. Heat generated from the heat generating component 131 is transferred and radiated to the base 110C via the circuit board 130 and the heat transfer base portion 111.

The circuit board 130 includes the solder resist films 135a and 135b on the front side and the back side, which are provided on the signal patterns 134a and 134b on the front side and the back side, respectively, the front-surface electroconductive pattern 132a to which the heat transfer block 131b of the heat generating component 131 is to be soldered, and the back-surface electroconductive pattern 132b connected to the front-surface electroconductive pattern 132a through the plated holes so as to transfer heat. The insulating sheet 112 having a thickness dimension two or more times larger than each of the thickness dimensions of the solder resist films 135a and 135b is provided in the gap between the back-surface electroconductive pattern 132b on which the solder resist film is not formed and the heat transfer base portion 111.

The base-side hold portion 113 and the cover-side hold portion 123 are formed at positions along at least one pair of opposed sides of the base 110C and along at least one pair of opposed sides of the cover 120C, respectively. The base-side hold portion 113 and the cover-side hold portion 123 are integrated and fixed by the plurality of fastening elements 140 configured to allow the base-side hold portion 113 and the cover-side hold portion 123 to be brought into pressure contact with and hold the circuit board 130 in a sandwiched manner at positions along at least one pair of opposed sides.

Further, the height difference dimension G0 between the hold surface of the base-side hold portion 113 and the upper surface of the heat transfer base portion 111 before the start of fastening of the base 110C and the cover 120C with the plurality of fastening elements 140 is smaller than the minimum dimension of the thickness dimension T0 of the insulating sheet 112.

When the circuit board 130 is mounted under a state in which the insulating sheet 112 is placed on the upper surface of the heat transfer base portion 111, the residual gap of T0−G0>0, which is obtained by subtracting the height difference dimension G0 from the thickness dimension T0, is formed between the back surface of the circuit board 130 and the base-side hold portion 113.

The plurality of protruding portions 121 are formed on the inner surface of the cover 120C. The elastic bodies 122 to be brought into abutment against the circuit board 130 are provided to the distal end surfaces of the protruding portions 121.

When the cover 120C is mounted on the upper surface of the circuit board 130, the elastic bodies 122 are first brought into abutment against the front surface of the circuit board 130. Subsequently, when tightening of the fastening elements 140 is started, compression of the elastic bodies 122 starts. Along with an operation of tightening the fastening elements 140, the curvature deformation of the circuit board 130 and the compression of the elastic bodies 122 progress.

The height dimension of each of the protruding portions 121 and the thickness dimension of each of the elastic bodies 122 are determined so that, at the time of completion of the tightening of the fastening elements 140, the circuit board 130 is in pressure contact with and sandwiched between the base-side hold portion 113 and the cover-side hold portion 123, and the elastic bodies 122 remain in a compressed state between the distal end surfaces of the protruding portions 121 and the front surface of the circuit board 130.

The heat transfer base portion 111a is arranged at the position shifted closer to the base-side hold portion 113. The first arm length L1 corresponding to the distance dimension between the inner end portion of the cover-side hold portion 123 and the opposed end surface of the insulating sheet 112 has a value four or more times larger than the thickness dimension of the circuit board 130.

The protruding portions 121 are omitted at the positions in the vicinity of the heat generating component 131, which are close to the cover-side hold portion 123.

As described above, in relation to claim 6 of this invention, when the heat transfer base portion is arranged at the position shifted closer to the base-side hold portion, the first arm length L1 corresponding to the distance dimension between the cover-side hold portion and the opposed end surface of the insulating sheet has a value four or more times larger than the thickness dimension of the circuit board. The protruding portions are omitted at the positions in the vicinity of the heat generating component, which are close to the cover-side hold portion.

Thus, the above-mentioned configuration has a feature in that, even when the heat transfer base portion is arranged on an outer portion of the base, the residual gap T0−G0 is absorbed by the curvature deformation of the circuit board to enable the integration of the base and the cover with the fastening elements.

The connector housing 138 made of a resin is provided to the side opening portion of the cover 120C. The connector housing 138 hermetically seals and houses the circuit board 130 with the second annular sealing material 142 provided between the side opening portion of the cover 120C and one side of the base 110C.

The first annular sealing material 141 and the second annular sealing material 142 three-dimensionally cross each other with the common-portion annular sealing material 143 provided on the base 110C along the one side as the common portion.

The plurality of connection terminals 139 for wiring connection to an external device are press-fitted and held in the connector housing 138. At the same time, the orthogonally bent portions of the connection terminals 139 are soldered to the circuit board 130.

The second arm length L2 corresponding to the dimension from the end surface of the insulating sheet 112 provided between the heat transfer base portion 111b and the circuit board 130 to the orthogonally bent portion of the connection terminal 139 is equal to or larger than the dimension L3 of the horizontally projecting portion of the connection terminal 139 press-fitted into and fixed in the connector housing 138.

As described above, in relation to claim 3 of this invention, when the connector housing made of a resin is provided to the side opening portion of the cover and the heat transfer base portion is formed at the position close to the connector housing into which the connection terminals for external connection are press-fitted and fixed, the second arm length L2 corresponding to the dimension from the end surface of the insulating sheet to the orthogonally bent portion of the connection terminal is equal to or larger than the dimension L3 of the horizontally projecting portion of the connection terminal press-fitted and fixed to the connector housing.

Thus, the third embodiment has a feature in that, even when the curvature deformation of the circuit board occurs due to tightening of the fastening elements, a stress in the soldered-joint portions, which may be generated by curvature deformation of the horizontally projecting portions of the connection terminals, can be restricted and suppressed.

The first embodiment and the second embodiment also have the same feature.

REFERENCE SIGNS LIST 100A to 100C board housing case, 110A to 110C base, 111 heat transfer base portion, 111a heat transfer base portion (peripheral portion), 111b heat transfer base portion (opening portion), 112 insulating sheet, 113 base-side hold portion, 120A to 120C cover, 121 protruding portion, 122 elastic body, 123 cover-side hold portion, 124 heat transfer protrusion, 130 circuit board, 131 heat generating component, 131a electrode terminal, 131b heat transfer block, 132a front-surface electroconductive pattern, 132b back-surface electroconductive pattern, 134a signal pattern (front side), 134b signal pattern (back side), 135a solder resist film (front side), 135b solder resist film (back side), 137 thermal adhesive, 138 connector housing, 139 connection terminal, 140 fastening element, 141 first annular sealing material, 142 second annular sealing material, 143 common-portion annular sealing material, G0 height difference dimension, L1 first arm length, L2 second arm length, L3 dimension of the horizontally projecting portion, Sg air gap portion, T0 thickness dimension, T0–G0 residual gap

The invention claimed is:

1. A board housing case, comprising:
a circuit board hermetically sealed and housed in a case including a base made of a metal and a cover made of a resin or a metal;
a heat generating component being a surface-mount component mounted on a front surface of the circuit board, the front surface being opposed to an inner surface of the cover; and
a heat transfer base portion formed on an inner surface of the base, the inner surface being opposed to a back surface of the circuit board,
wherein heat generated from the heat generating component is transferred and radiated to the base via the circuit board and the heat transfer base portion,
wherein the circuit board includes:
solder resist films on a front side and a back side, the solder resist films being provided on signal patterns on a front side and a back side;
a front-surface electroconductive pattern to which a heat transfer block of the heat generating component is to be soldered; and
a back-surface electroconductive pattern connected to the front-surface electroconductive pattern through plated holes so as to transfer heat,
wherein an insulating sheet having a thickness dimension two or more times larger than a thickness dimension of each of the solder resist films is provided in a gap between the back-surface electroconductive pattern without the solder resist film and the heat transfer base portion,
wherein a base-side hold portion and a cover-side hold portion are formed at positions along at least a pair of opposed sides of the base and at least a pair of opposed sides of the cover, respectively, and the base-side hold portion and the cover-side hold portion are integrated and fixed by a plurality of fastening elements configured to allow the base-side hold portion and the cover-side hold portion to be brought into pressure contact with and hold the circuit board in a sandwiched manner at positions along at least a pair of opposed sides of the circuit board,
wherein a height difference dimension G0 between a hold surface of the base-side hold portion and an upper surface of the heat transfer base portion before start of fastening of the base and the cover with the plurality of fastening elements is smaller than a minimum dimension of a thickness dimension T0 of the insulating sheet,
wherein, when the circuit board is mounted under a state in which the insulating sheet is placed on the upper surface of the heat transfer base portion, a residual gap of T0–G0>0 obtained by subtracting the height difference dimension G0 from the thickness dimension T0 is formed between the back surface of the circuit board and the base-side hold portion,
wherein a plurality of protruding portions are formed on the inner surface of the cover, and an elastic body to be brought into abutment against the circuit board is provided to a distal end surface of each of the protruding portions,
wherein, when the cover is placed on an upper surface of the circuit board, the elastic bodies are first brought into abutment against the front surface of the circuit board,
wherein, when tightening of the fastening elements is subsequently started, compression of the elastic bodies starts, and curvature deformation of the circuit board and the compression of the elastic bodies progress along with an operation of tightening the fastening elements, and
wherein a height dimension of each of the protruding portions and a thickness dimension of each of the elastic bodies are determined so that, at time of completion of the tightening of the fastening elements, the circuit board is in pressure contact with and sandwiched between the base-side hold portion and the cover-side hold portion, and the elastic bodies remain in a compressed state between the distal end surfaces of the protruding portions and the front surface of the circuit board.

2. The board housing case according to claim 1,
wherein an annular groove formed by an elongated recessed portion and an elongated protruding portion is formed in outer peripheral portions of the base and the cover along contours, and a first annular sealing material is filled and applied to the annular groove,
wherein the annular groove forms an air gap portion Sg into which surplus part of the first annular sealing material flows out under a state in which the circuit board is in pressure contact with and sandwiched between the base-side hold portion and the cover-side hold portion, and wherein the elastic bodies are made of a silicone resin-based adhesive material having the same hardness as a hardness of the first annular sealing material.

3. The board housing case according to claim 2, wherein a connector housing made of a resin is provided to a side opening portion of the cover, and the connector housing hermetically seals and houses the circuit board with a second annular sealing material provided between the side opening portion of the cover and one side of the base, wherein the first annular sealing material and the second annular sealing material three dimensionally cross each other with a common-portion annular sealing material provided to the base along the one side as a common portion, wherein a plurality of connection terminals for wiring connection to an external device are press-fitted and held in the connector housing, and orthogonally bent portions of the connection terminals are soldered to the circuit board, and wherein a second arm length L2 corresponding to a dimension from an end surface of the insulating sheet provided between the heat transfer base portion and the circuit board to the orthogonally bent portion of the connection terminal is equal to or larger than a dimension L3 of a horizontally projecting portion of the connection terminal press-fitted into and fixed to the connector housing.

4. The board housing case according to claim 3, wherein the cover is formed by aluminum die casting, and, in addition to the protruding portions, a heat transfer protrusion is formed on the inner surface of the cover, and wherein a thermal adhesive is applied to a gap portion formed between a non-soldered surface of the heat generating component to be joined by soldering to the circuit board and an opposed surface of the heat transfer protrusion.

5. The board housing case according to claim 3, wherein the heat generating component includes the heat transfer block that has a rectangular shape with protruding type or non-protruding type electrode terminals provided to one or two pairs of opposed sides and is to be soldered to the front-surface electroconductive pattern of the circuit board, and wherein the protruding portions are arranged at one or two pairs of corners of the heat generating component or at intermediate positions along a pair of opposed sides without the electrode terminals.

6. The board housing case according to claim 3, wherein the heat transfer base portion is arranged at a position shifted closer to the base-side hold portion, and a first arm length L1 corresponding to a distance dimension between an inner end portion of the cover-side hold portion and an opposed end surface of the insulating sheet has a value four or more times larger than a thickness dimension of the circuit board, and wherein at least one of the protruding portions is omitted at a position in vicinity of the heat generating component, the position being close to the cover-side hold portion.

7. The board housing case according to claim 2, wherein the cover is formed by aluminum die casting, and, in addition to the protruding portions, a heat transfer protrusion is formed on the inner surface of the cover, and wherein a thermal adhesive is applied to a gap portion formed between a non-soldered surface of the heat generating component to be joined by soldering to the circuit board and an opposed surface of the heat transfer protrusion.

8. The board housing case according to claim 2, wherein the heat generating component includes the heat transfer block that has a rectangular shape with protruding type or non-protruding type electrode terminals provided to one or two pairs of opposed sides and is to be soldered to the front-surface electroconductive pattern of the circuit board, and wherein the protruding portions are arranged at one or two pairs of corners of the heat generating component or at intermediate positions along a pair of opposed sides without the electrode terminals.

9. The board housing case according to claim 2, wherein the heat transfer base portion is arranged at a position shifted closer to the base-side hold portion, and a first arm length L1 corresponding to a distance dimension between an inner end portion of the cover-side hold portion and an opposed end surface of the insulating sheet has a value four or more times larger than a thickness dimension of the circuit board, and wherein at least one of the protruding portions is omitted at a position in vicinity of the heat generating component, the position being close to the cover-side hold portion.

10. The board housing case according to claim 1, wherein the cover is formed by aluminum die casting, and, in addition to the protruding portions, a heat transfer protrusion is formed on the inner surface of the cover, and wherein a thermal adhesive is applied to a gap portion formed between a non-soldered surface of the heat generating component to be joined by soldering to the circuit board and an opposed surface of the heat transfer protrusion.

11. The board housing case according to claim 10, wherein the heat generating component includes the heat transfer block that has a rectangular shape with protruding type or non-protruding type electrode terminals provided to one or two pairs of opposed sides and is to be soldered to the front-surface electroconductive pattern of the circuit board, and wherein the protruding portions are arranged at one or two pairs of corners of the heat generating component or at intermediate positions along a pair of opposed sides without the electrode terminals.

12. The board housing case according to claim 10, wherein the heat transfer base portion is arranged at a position shifted closer to the base-side hold portion, and a first arm length L1 corresponding to a distance dimension between an inner end portion of the cover-side hold portion and an opposed end surface of the insulating sheet has a value four or more times larger than a thickness dimension of the circuit board, and wherein at least one of the protruding portions is omitted at a position in vicinity of the heat generating component, the position being close to the cover-side hold portion.

13. The board housing case according to claim 1, wherein the heat generating component includes the heat transfer block that has a rectangular shape with protruding type or non-protruding type electrode terminals provided to one or two pairs of opposed sides and is to be soldered to the front-surface electroconductive pattern of the circuit board, and wherein the protruding portions are arranged at one or two pairs of corners of the heat generating component or at intermediate positions along a pair of opposed sides without the electrode terminals.

14. The board housing case according to claim 13, wherein the heat transfer base portion is arranged at a position shifted closer to the base-side hold portion, and a first arm length L1 corresponding to a distance dimension between an inner end portion of the cover-side hold portion and an opposed end surface of the insulating sheet has a value four or more times larger than a thickness dimension of the circuit board, and wherein at least one of the protruding portions is omitted at a position in vicinity of the heat generating component, the position being close to the cover-side hold portion.

15. The board housing case according to claim 1, wherein the heat transfer base portion is arranged at a position shifted closer to the base-side hold portion, and a first arm length L1 corresponding to a distance dimension between an inner end portion of the cover-side hold portion and an opposed end surface of the insulating sheet has a value four or more times larger than a thickness dimension of the circuit board, and wherein at least one of the protruding portions is omitted at a position in vicinity of the heat generating component, the position being close to the cover-side hold portion.

\* \* \* \* \*